United States Patent [19]
Yiu et al.

[11] Patent Number: 6,031,771
[45] Date of Patent: Feb. 29, 2000

[54] MEMORY REDUNDANCY CIRCUIT USING SINGLE POLYSILICON FLOATING GATE TRANSISTORS AS REDUNDANCY ELEMENTS

[75] Inventors: Tom D. Yiu, Milpitas, Calif.; Fuchia Shone, Hsinchu, Taiwan

[73] Assignee: Macronix International Co., Ltd., Hsinchu, Taiwan

[21] Appl. No.: 09/158,314

[22] Filed: Sep. 21, 1998

Related U.S. Application Data

[62] Division of application No. 08/825,873, filed as application No. PCT/US96/17300, Oct. 28, 1996.

[51] Int. Cl.[7] .................................................. G11C 16/06
[52] U.S. Cl. .................... 365/200; 365/201; 365/230.06; 365/185.09
[58] Field of Search ..................................... 365/201, 200

[56] References Cited

U.S. PATENT DOCUMENTS

| | | | |
|---|---|---|---|
| 3,753,244 | 8/1973 | Sumilas et al. | 340/172.5 |
| 4,047,163 | 9/1977 | Choate et al. | 340/173 R |
| 4,250,570 | 2/1981 | Tsang et al. | 365/200 |
| 4,464,736 | 8/1984 | Smith | 365/200 |
| 4,649,520 | 3/1987 | Eitan | 365/185 |
| 4,725,980 | 2/1988 | Wakimoto et al. | 365/185 |
| 4,807,003 | 2/1989 | Mohammadi et al. | 357/23.5 |
| 4,970,565 | 11/1990 | Wu et al. | 357/23.5 |
| 4,970,686 | 11/1990 | Naruke et al. | 365/96 |
| 5,089,433 | 2/1992 | Anand et al. | 437/40 |
| 5,208,780 | 5/1993 | Iwase et al. | 365/225.7 |
| 5,257,230 | 10/1993 | Nobori et al. | 365/200 |
| 5,287,310 | 2/1994 | Schreck et al. | 365/189.05 |

(List continued on next page.)

FOREIGN PATENT DOCUMENTS

| | | | |
|---|---|---|---|
| 2-238661 | 9/1990 | Japan | H01L 27/112 |
| 4-155959 | 5/1992 | Japan | H01L 27/10 |
| 7-230698 | 8/1995 | Japan | G11C 29/00 |

OTHER PUBLICATIONS

Cacharelis, P. et al., "A Modular 1$\mu$m CMOS Single Polysilicon EPROM PLD Technology", IEDM, Dec. 1988, pp. 60–63.

Ohsaki, K. et al., "A Planar Type EEPROM Cell Structure By Standard CMOS Process and Applications", 1993 Symposium on VLSI Technology, Digest of Technical Papers, IEEE, May 1993, pp. 55–56.

McKenny, V., "A 5V 64K EPROM utilizing Redundant Circuitry", IEEE International Solid–State Circuits Conference, Digest of Technical Papers, IEEE, Feb. 1980, pp. 146–147.

*Primary Examiner*—Viet Q. Nguyen
*Attorney, Agent, or Firm*—Haynes & Beffel LLP

[57] ABSTRACT

A read-only memory device is provided which comprises an array of read-only memory cells arranged in rows and columns. An additional row or column of flat, single polysilicon floating gate memory cells is provided. A row or column decoder coupled to the array of read-only memory cells is responsive to addresses corresponding to rows or columns in the array for selecting addressed rows or columns. Control circuitry including a programmable store for identifying a defective row or column in the array to be replaced by the additional row or column, selects the additional row or column and replaces the defective row or column in response to an address corresponding to the defective row or column. In addition, circuitry is provided on the integrated circuit which allows access to the additional row or column of floating gate memory cells for programming the additional row or column. The additional row or column of floating gate memory cells is comprised of flat or single polysilicon floating gate cells having buried diffusion control gates. This structure is particularly applied to an array of mask ROM cells. Furthermore, the additional row or column of floating gate memory cells can be implemented in layout of mask ROM cells itself, and a very dense compact structure without requiring additional process steps to implement the redundant row or column.

24 Claims, 9 Drawing Sheets

U.S. PATENT DOCUMENTS

| | | | |
|---|---|---|---|
| 5,291,046 | 3/1994 | Kumakura | 257/316 |
| 5,386,386 | 1/1995 | Ogihara | 365/200 |
| 5,396,468 | 3/1995 | Harari et al. | 365/218 |
| 5,440,159 | 8/1995 | Larsen et al. | 257/318 |
| 5,457,335 | 10/1995 | Kuroda et al. | 257/318 |
| 5,504,706 | 4/1996 | D'Arrigo et al. | 365/185.18 |
| 5,687,114 | 11/1997 | Khan | 365/185.03 |
| 5,774,396 | 6/1998 | Lee et al. | 365/185.09 |
| 5,835,408 | 11/1998 | Akaogi et al. | 365/185.18 |

MEMORY REDUNDANCY CIRCUIT USING SINGLE POLYSILICON FLOATING GATE TRANSISTORS AS REDUNDANCY ELEMENTS

This application is a division of U.S. patent application Ser. No. 08/825,873, filed Apr. 2, 1997, which is a U.S. national stage filing of PCT application PCT/US96/17300, filed Oct. 28, 1996, both of which are incorporated herein by reference in their entirety.

BACKGROUND OF THE INVENTION

1. Field of the Invention

The present invention relates to integrated circuit memory design, and more particularly to circuitry for providing on chip redundancy for memory arrays.

2. Description of Related Art

In the manufacture of integrated circuit memory devices, it is common to provide a redundant segment of memory in addition to the main array, which can be used as a replacement for defective segments of the array. Thus, additional rows or columns of memory cells are provided on an integrated circuit memory device. After manufacturing of the device, it is tested to determine whether all segments of the main array are in good condition. If any segment of the array fails the testing, then it may be replaced by the redundant segment by storing an address on the chip characterizing the failed segment, and using circuitry which is responsive to the stored address to access the additional segment in place of the defective one. This process significantly improves manufacturing yield for memory circuits.

Substantial prior art in this field is represented for instance by U.S. Pat. No. 3,753,244, U.S. Pat. No. 4,047,163, U.S. Pat. No. 4,250,570, and publications such as McKinney, "A 5 V 64K EPROM Utilizing Redundant Circuitry", 1980 IEEE International Solid-State Circuits Conference, pages 146–147.

One field in which redundancy has not been widely applied is in the field of high density read-only memory ROM devices, such as mask ROM. Because the ROM cells in a mask ROM are programmed using a manufacturing step, it is impossible to use other mask ROM cells as an additional replacement segment. This is true because the additional segment of ROM cells can not be programmed after testing with the data from the failed segment. Thus, unlike programmable memory devices, in which the memory elements of the array are designed to be programmed after manufacturing, and in which redundant elements are easily utilized, read-only memory circuits do not readily allow the use of redundancy.

As the density of memory arrays shrinks, and the need to prove yield is increased, applying redundant elements to read-only memory devices is desired. However, the redundant elements must be compact and compatible with the ROM manufacturing process, so that the cost of implementing the redundant elements does not outweigh any gains in manufacturing yield achieved by the redundancy.

SUMMARY OF THE INVENTION

The present invention provides a unique redundancy element for an integrated circuit memory based on a horizontally laid out floating gate memory cell. The invention is particularly adapted to read-only memory arrays, such as mask ROM. The use of the horizontally laid out floating gate memory cell with a mask ROM process allows redundancy to be implemented on a mask ROM without extra process steps in fabrication, and providing significant yield improvements.

A horizontally laid out floating gate memory cell is basically a single polysilicon floating gate transistor fabricated such that the source, drain, and control gate are implemented as buried diffusion regions. A single polysilicon element overlies the control gate diffusion and the region between the source and drain to provide a floating gate structure in a planar or flat format. This structure has been described in the following prior art references: U.S. Pat. No. 4,649,520, entitled "Single Layer Polycrystalline Floating Gate", invented by Eitan; U.S. Pat. No. 4,807,003, entitled "High-Reliability Single Poly EEPROM Cell", invented by Mohammadi; Cacharelis, et al., "A Modular One $\mu m$ CMOS Single Polysilicon EPROM PLD Technology", IEDM, 1988, page 60; Ohsaki, et al., "A Planar Type EEPROM Cell Structure by Standard CMOS Process and Applications", VLSI Symposium 1993, page 55.

Accordingly, the invention can be characterized as a memory redundancy system based on an additional row or column of floating gate memory cells on an integrated circuit memory. Thus, a row of redundant elements for a memory having a plurality of bit lines and a plurality of word lines on an integrated circuit substrate comprises, according to the present invention, a row of floating gate memory cells. Floating gate memory cells in the row include drain contacts in the substrate coupled with corresponding bit lines in the plurality of bit lines, source contacts in the substrate spaced away from the drain contacts, control gate contacts in the substrate spaced away from the source contacts, and floating gates insulated from and extending over respective regions between the drain contacts and source contacts and over the control gate contacts. The source contacts for the row may be formed in a single buried diffusion region which extends parallel to the word lines. Also, the control gate contacts for the row may be coupled together in a single buried diffusion region elongated parallel to the word lines.

According to one aspect of the invention, the control gate buried diffusion region has a conductivity type the same as the substrate, and is formed in a deeper buried diffusion region of an opposite polarity type. This isolates it from the substrate, and allows the control gate to be used for applying positive and negative voltages to the floating gate cells for programming and/or erasing.

The invention can also be characterized as a column of redundant elements. This column of redundant elements comprises a column of floating gate cells having drain contacts in the substrate, each cell corresponding to a word line in the plurality of word lines in the array. Source contacts in the substrate are spaced away from the drain contacts, and control gate contacts in the substrate are spaced away from the source contacts. The floating gates are insulated from and extend over respective regions between the drain contacts and the source contacts and over the control gate contacts. In the column structure, the source contacts again are coupled together in a single buried diffusion region; however in this case they are elongated parallel to the bit lines. Similarly, the control gate contacts are formed in a single buried diffusion region parallel to the bit lines, which is formed in a deeper diffusion region of an opposite polarity type. Further, in the column redundancy element structure, an additional bit line is provided and coupling circuitry is used for connecting selected ones of the plurality of drain contacts to the additional bit line in response to signals on corresponding word lines.

According to yet another aspect of the invention, a read-only memory device is provided which comprises an array of read-only memory cells arranged in rows and columns. An additional row or column of floating gate memory cells is provided. A row or column decoder coupled to the array of read-only memory cells is responsive to addresses corresponding to rows or columns in the array for selecting addressed rows or columns. Control circuitry including a programmable store identifies a defective row or column in the array to be replaced by the additional row or column, selects the additional row or column and replaces the defective row or column in response to an address corresponding to the defective row or column. In addition, circuitry is provided on the integrated circuit which allows access to the additional row or column of floating gate memory cells for programming the additional row or column with data of the defective row or column of the main read-only memory array. The additional row or column of floating gate memory cells is comprised of flat or single polysilicon floating gate cells having buried diffusion control gates, as explained above. This structure is particularly applied to an array of mask ROM cells. Furthermore, the additional row or column of floating gate memory cells can be implemented within the array layout of mask ROM cells itself, and a very dense, compact structure is provided without requiring a significant number of additional process steps to implement the redundant row or column.

According to yet another aspect of the invention, an array architecture is provided for a memory device in a semiconductor substrate providing the floating gate memory redundancy elements as discussed above. According to this aspect, the semiconductor substrate having a first conductivity type is utilized for the memory device. A plurality of conductive buried diffusion lines of a second conductivity type arranged generally parallel in a first direction is included to provide bit lines for the array. A plurality of word lines, overlying and insulated from the plurality of conductive buried diffusion lines, and arranged generally orthogonal to the first direction is included. Regions beneath the word lines and between respective pairs of buried diffusion lines provide channel regions for an array of read-only memory cells. Implants in a subset of the channel regions in the array establish data in the array. A plurality of bit line conductors overlie and are insulated from the word lines and the plurality of buried diffusion lines. Circuitry selectively connects buried diffusion lines and bit line conductors. A plurality of column select transistors are coupled to the bit line conductors and are responsive to addresses corresponding to columns in the array to selectively connect addressed columns to output circuitry. Furthermore, a row decoder coupled to the plurality of word lines in response to the addresses corresponding to rows in the array selects word lines of address rows.

The additional row of flat floating gate cells is formed using the following array architecture elements:

- a first additional buried diffusion line of the second conductivity type arranged generally parallel to the plurality of word lines;
- a second additional buried diffusion line of the first conductivity type arranged generally parallel to the plurality of word lines, and isolated from the semiconductor substrate;
- a plurality of buried diffusion drain contacts adjacent to corresponding ones of the plurality of buried diffusion lines;
- an additional conductor near and insulated from the plurality of conductive buried diffusion lines and the plurality of drain contacts, arranged generally parallel to the plurality of word lines so that regions in the semiconductor substrate between the plurality of conductive buried diffusion lines and the plurality of drain contacts provide a set of channel regions for select transistors which connect the plurality of drain contacts to corresponding ones of the plurality of conductive buried diffusion regions in response to a signal on the additional conductor; and
- a plurality of floating gates, each overlying a region between a corresponding drain contact and the first additional buried diffusion line and extending over the second additional buried diffusion line, and arranged so that regions between the first additional buried diffusion line and the plurality of drain contacts provide channel regions for a row of floating gate memory cells, the first additional buried diffusion line provides source regions and the second additional buried diffusion line provides control gates.

Control circuitry is provided on the integrated circuit which provides a programmable store to identify a defective row in the array to be replaced by the row of floating gate memory cells as discussed above.

The invention can also be characterized as a memory device as described where a redundant column is provided. In this aspect, a redundant column of floating gate cells is based on first, second, and third additional buried diffusion lines. The first additional buried diffusion line is arranged generally parallel to the plurality of conductive buried diffusion regions which provide the bit lines. The second additional buried diffusion line is arranged generally parallel to the plurality of conductive buried diffusion regions and spaced away from the first additional buried diffusion line. The third additional buried diffusion line is formed parallel to the conductive buried diffusion regions. It is isolated from the substrate by a deeper diffusion region of an opposite conductivity type as discussed above.

The plurality of buried diffusion drain contacts of the floating gate cells are associated with corresponding word lines of the plurality of word lines. These contacts are coupled to the first additional buried diffusion line which acts as a replacement bit line, by means of transistors formed by extending the word lines over the first additional buried diffusion line and corresponding ones of the plurality of drain contacts so that regions between the drain contacts and the first additional buried diffusion line provide channels of select transistors. The floating gates for the redundant column overlie a region between the corresponding drain contact and the second additional buried diffusion line, and extend over the third additional buried diffusion line. Floating gates are arranged so that regions between the drain contact and the second buried diffusion line provide a channel region, and the third additional buried diffusion line provides a control gate. Control circuitry for selecting the redundant column is provided as well.

Accordingly, the present invention provides a memory device, and particularly a read-only memory device, with a redundancy element based on flat floating gate memory cells. A unique layout of an array architecture is provided allowing a compact structure to be implemented without a significant number of additional process steps for the read-only memory. Further, a unique control gate structure is provided which allows application of positive or negative bias potentials to the floating gate memory cells in the redundant row or column for the purposes of programming or erasing a redundant element.

Other aspects and advantages of the present invention can be seen upon review of the figures, the detailed description, and the claims which follow.

DETAILED DESCRIPTION OF PREFERRED EMBODIMENTS

Figure 1:
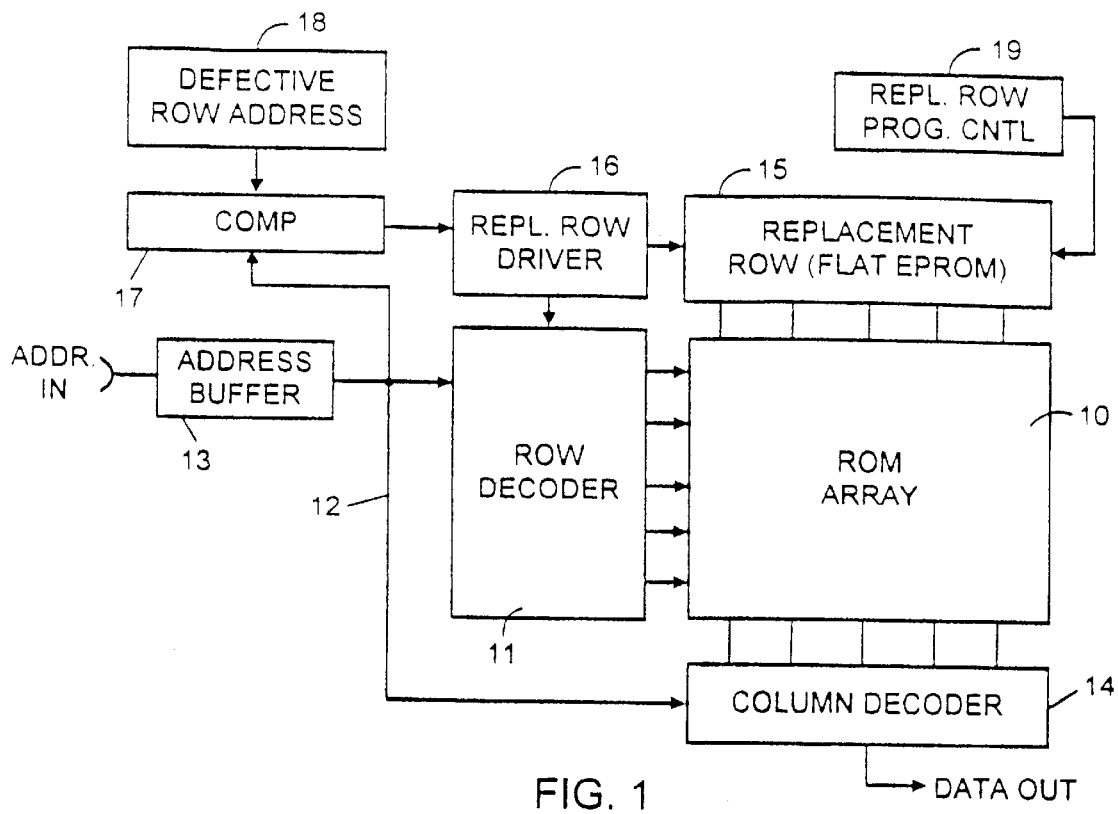
FIG. 1 is a simplified block diagram of a read-only memory circuit including a replacement row of flat floating gate cells.
Figure 2:
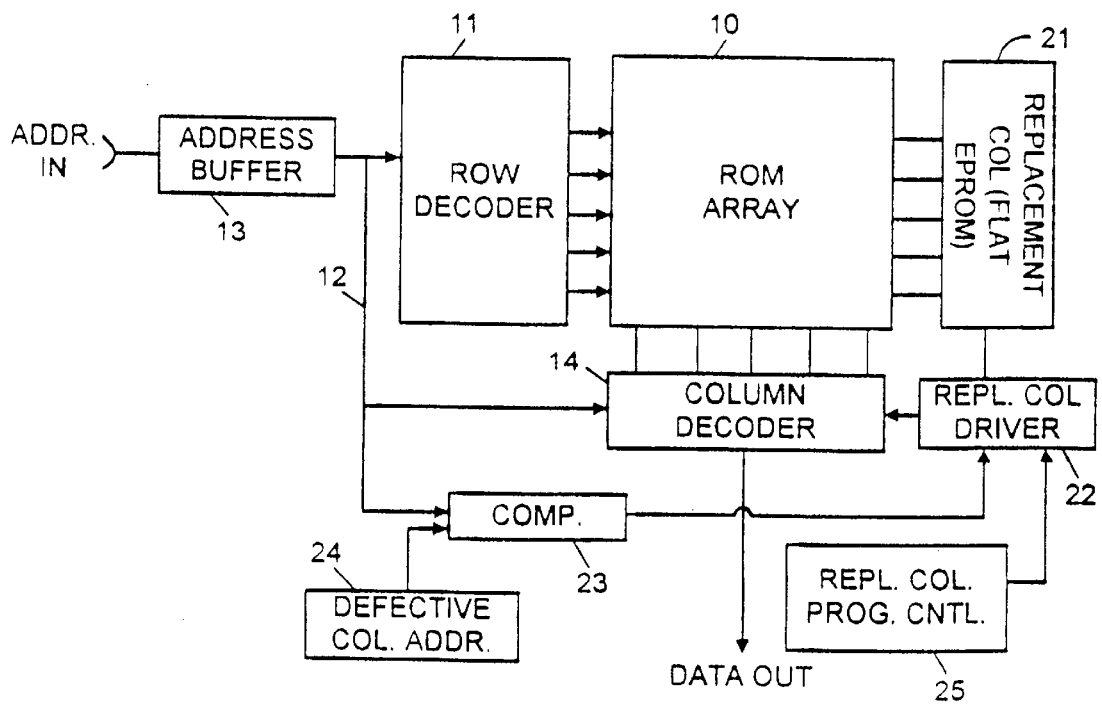
FIG. 2 is a simplified block diagram of a read-only memory circuit including a replacement column of flat floating gate cells.

A detailed description of preferred embodiments of the present invention is provided with respect to the figures, in which FIGS. 1 and 2 illustrate basic architectures of the present invention.

FIG. 1 shows a read-only memory device having row redundancy according to the present invention. Thus, the device includes a ROM array 10. A row decoder 11 is responsive to addresses on line 12 supplied by an address buffer 13. The row decoder selects word lines for the ROM array to address specified rows in response to the input addresses. In addition, a column decoder and output block 14 is included coupled to bit lines in the ROM array 10. The column decoder is responsive to addresses from the address buffer 13 on line 12 to select columns for supplying output data.

As can be seen, coupled with the ROM array 10 is a replacement row 15 made up of flat floating gate cells. The replacement row 15 is selected by a replacement row driver 16, which is controlled by the output of a comparator 17. The comparator 17 selects the replacement row driver 16, when the address on line 12 matches a defective row address stored in a programmable store 18, such as fuse array, an EPROM cell array, or other memory elements which may be programmed during device testing. In addition, replacement row programming control circuitry 19 is provided on the circuit. This control circuitry 19 provides access to the replacement row of flat floating gate cells for the purposes of programming the replacement row with data of a defective row in the ROM array 10.

Thus, during testing of a ROM device as shown in FIG. 1, a defective row in the ROM array 10 may be detected. The defective row address is stored in the programmable store 18, and the data from the defective row is programmed into the replacement row 15 of flat floating gate cells by means of access provided by the replacement row programming control circuitry 19. This access may be provided using special pins for providing programming potentials for the floating gate cells, using charge pumps on chip that allow the generation of programming voltages based on the standard supply voltages, or other techniques known in the art.

FIG. 2 illustrates an alternative configuration of the present invention in which a replacement column is provided. Thus, the circuitry of FIG. 2 includes the array 10, the row decoder 11, the column decoder 14, and the address buffer 13. The address buffer 13 supplies an address on line 12 to the row decoder 11 and to the column decoder 14. Coupled with the ROM array is a replacement column 21 of flat floating gate cells. Replacement column 21 is selected by a replacement driver 22. The replacement driver 22 is selected by the output of a comparator 23. The inputs to the comparator 23 include the defective column address from a programmable store 24, and the address input from line 12. Replacement column programming control circuitry 25 is included for the purposes of programming the replacement column with data of the defective column in the ROM array 10.

The redundancy circuitry shown in FIGS. 1 and 2 is based on the use of a defective address storage element 18, 24, a comparator 17, 23, and an address input buffer 13. Alternative logic circuits which operate to utilize the replacement row or column in place of a defective row or column in the array can be implemented as known in the art.

Figure 3:
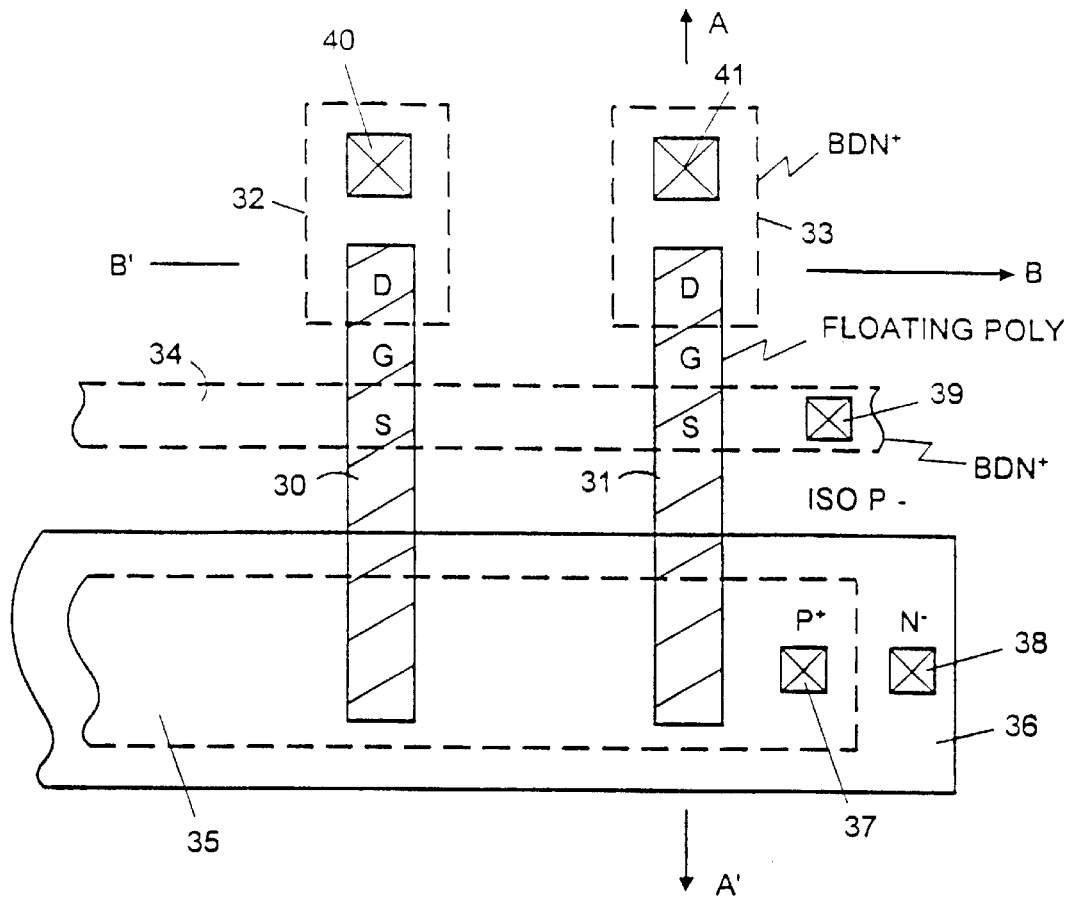
FIG. 3 illustrates one layout for a flat floating gate memory device used according to the present invention.
Figure 4:
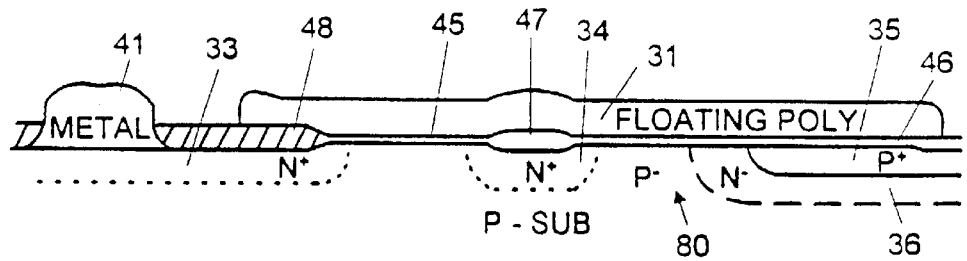
FIG. 4 is a cross-sectional view taken along the line A–A' in the circuit of FIG. 3.
Figure 5:
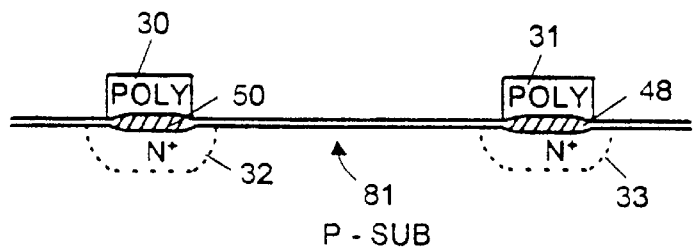
FIG. 5 is a cross-sectional view of the floating gate memory cell of FIG. 3, taken along the line B–B'.

A layout for the replacement row or column of FIGS. 1 and 2 can be implemented as shown in FIGS. 3 through 5. FIG. 3 provides a top view of the active elements of a pair of floating gate cells. Beginning from the top, the cell structure includes a floating gate 30, 31 which overlies a drain contact region 32, 33, a source diffusion line 34, and a control gate diffusion line 35. The drain contact 32 and 33 and the source diffusion line 34 are formed of a conductivity type opposite that of the substrate. Thus, for a p-type substrate, the drain contacts 32, 33 and source diffusion region 34 are formed using an n+ buried diffusion region. The isolation area (ISO) between the source 34 and the control gate diffusion 35 is doped during a p-type threshold enhancement implant, or alternatively during ROM code implant step to raise the threshold level, and provide isolation.

The control gate 35 is formed in a p+ buried diffusion region. This p+ buried diffusion region is isolated from the p– substrate by the n– buried diffusion region 36 which is deeper than the p+ diffusion region and surrounds it. By biasing the p+ diffusion region at contact 37 opposite the n– diffusion region at contact 38, a reversed biased PN junction is provided, isolating the control gate diffusion region 35 from the substrate. The source diffusion region 34 is coupled to a contact 39 which is applied to the ground or VSS potential. The drain contacts 32, 33 are coupled to contacts 40, 41, which may be connected to bit lines in the array for the purposes of row redundancy or to select transistors controlled by word lines in the array to a redundant bit line for the purposes of column redundancy.

A cross-sectional view shown in FIG. 4 is taken along the line A–A' of FIG. 3. Thus, the floating gate 31, the drain contact 33, the metal contact 41, the source diffusion region 34, and the control gate diffusion region 35 are shown. Also, the isolating n-diffusion region 36 is illustrated. All of these structures are formed on a p-type substrate as illustrated. A channel oxide 45 is formed over a region between the drain contact 33 and the source diffusion region 34 to provide a channel region for the floating gate device. A floating gate 31 extends over the control gate region, and a thin oxide 46 separates the floating gate 31 from the control gate region 35. In region 80, between the n-diffusion region 36 and the source diffusion region 34, a p-type implant is used to cause the parasitic transistor to have a high threshold, or a thick oxide is formed to prevent formation of the parasitic transistor.

The oxides 47 and 48 over the source diffusion region and the drain contact 33 are thicker than over the channel region and the control gate shown in the Figure.

FIG. 5 illustrates a cross-section of the floating gate structure taken along the line B–B' of FIG. 3. This figure illustrates the floating gates 30 and 31 over the drain contacts 32 and 33, respectively. Thick oxide regions 48 and 50 between the floating gates and the drain regions are illustrated. In region 81, a threshold enhancement implant provides isolation.

Thus, the present invention includes fabrication and implementation of a single polysilicon non-volatile memory device as a ROM redundancy element. The drain and source of the device are formed by n+ buried diffusion in a contactless buried diffusion-type ROM technology. The single poly floating gate of the device lays across the drain and source regions and extends over the control gate in an isolated p+ region, where the p+ region can be formed during peripheral or ROM cell threshold voltage adjustment implants, or during the ROM code implant. A voltage applied to the p+ control gate region will be partially coupled to the floating gate. Thus, programming, erasing, and reading of the floating gate is achieved by controlling the voltage biases on the drain, source, and the control gate terminals.

The following tables set out voltage potentials used for program, erase, and read in two modes. The program controllers 19 and 25 of FIGS. 1 and 2 are operative to apply the appropriate potentials to the control gates, sources, and drains for programming and erasing purposes. Table 1 is for a first mode assuming a gate coupling ratio of about 60%, and hot electron programming to set a high threshold voltage, and Fowler-Nordheim erasing to set a low threshold voltage, and assuming a thin oxide thickness of about 90 Å over the channel region.

TABLE 1

| Bias Voltage | Program | Erase | Read |
| --- | --- | --- | --- |
| Vdd | 5V | 5V | 1.2V |
| Vss | 0V | float | 0V |

TABLE 1-continued

| Bias Voltage | Program | Erase | Read |
| --- | --- | --- | --- |
| p+ region | 10V | −10V | 5V |
| n− region | >= 10V | GND | >= 5V |

Table 2 illustrates operating biases assuming a gate coupling ratio of about 60%, and Fowler-Nordheim programming to a low threshold voltage and Fowler-Nordheim erasing to a high threshold voltage, using a total thin oxide thickness of about 90 Å.

TABLE 2

| Bias Voltage | Program | Erase | Read |
| --- | --- | --- | --- |
| Vdd | 5V | −8V | 1.2V |
| Vss | float | −8V | 0V |
| p+ region | −10V | 12V | 5V |
| n− region | GND | >= 12V | >= 5V |

Figure 6:
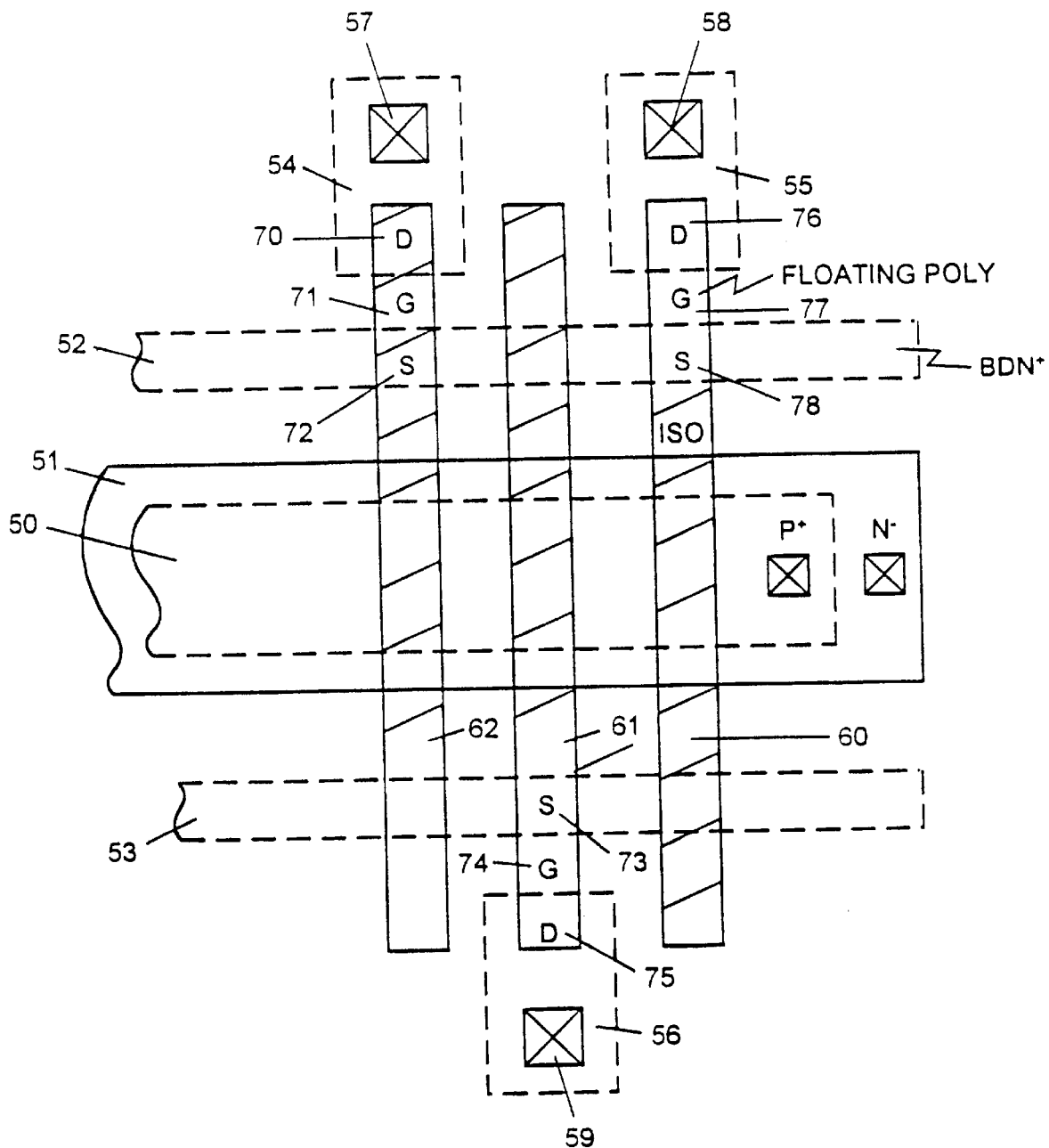
FIG. 6 is a diagram illustrating a layout of an alternative flat floating gate cell structure for use according to the present invention.

FIG. 6 illustrates an alternative layout for a row or column of floating gate memory cells according to the present invention. This alternative layout may allow for a more dense array, because of the metal contact pitch can be shared across more than one floating gate device. Thus, the structure of FIG. 6 includes a shared control gate p+ diffusion 50, formed in an n− diffusion 51. A first source diffusion region 52 is formed on one side of the control gate diffusion 50, and a second source diffusion region 53 is formed on the other side of the control gate diffusion 50. Drain contacts 54 and 55 are formed on the top of the structure and drain contact 56 is formed on the bottom of the structure as shown. Metal contacts 57, 58 and 59 are formed in respective drain contacts 54, 55, and 56. Floating gate poly structures 60, 61, and 62 are formed overlying the control gate 50, the source diffusion regions 52 and 53, and a portion of the drain contact regions 54 through 56. Thus, a first floating gate device generally having the drain at region 70, a channel and gate at region 71, and a source in region 72 is provided based on the floating gate poly 62. In the next floating gate 61, the source region is provided generally at 73, the gate and channel region is provided at generally 74, and a drain is provided generally at 75. Similarly, the third device based on floating gate poly 60 has a drain generally at 76, a channel and gate generally at 77, and a source generally at 78. The source regions 52 and 53 are isolated from the control gate region 50 by the region of substrate generally between the n− diffusion 51, and the source diffusion 52, or between the n− diffusion 51 and the source region 53, with thin oxide in the area, by threshold enhancement implants in the area, accomplished for example during a ROM code implant step. Alternatively, thick oxide isolation structures can be made.

Figure 7A:
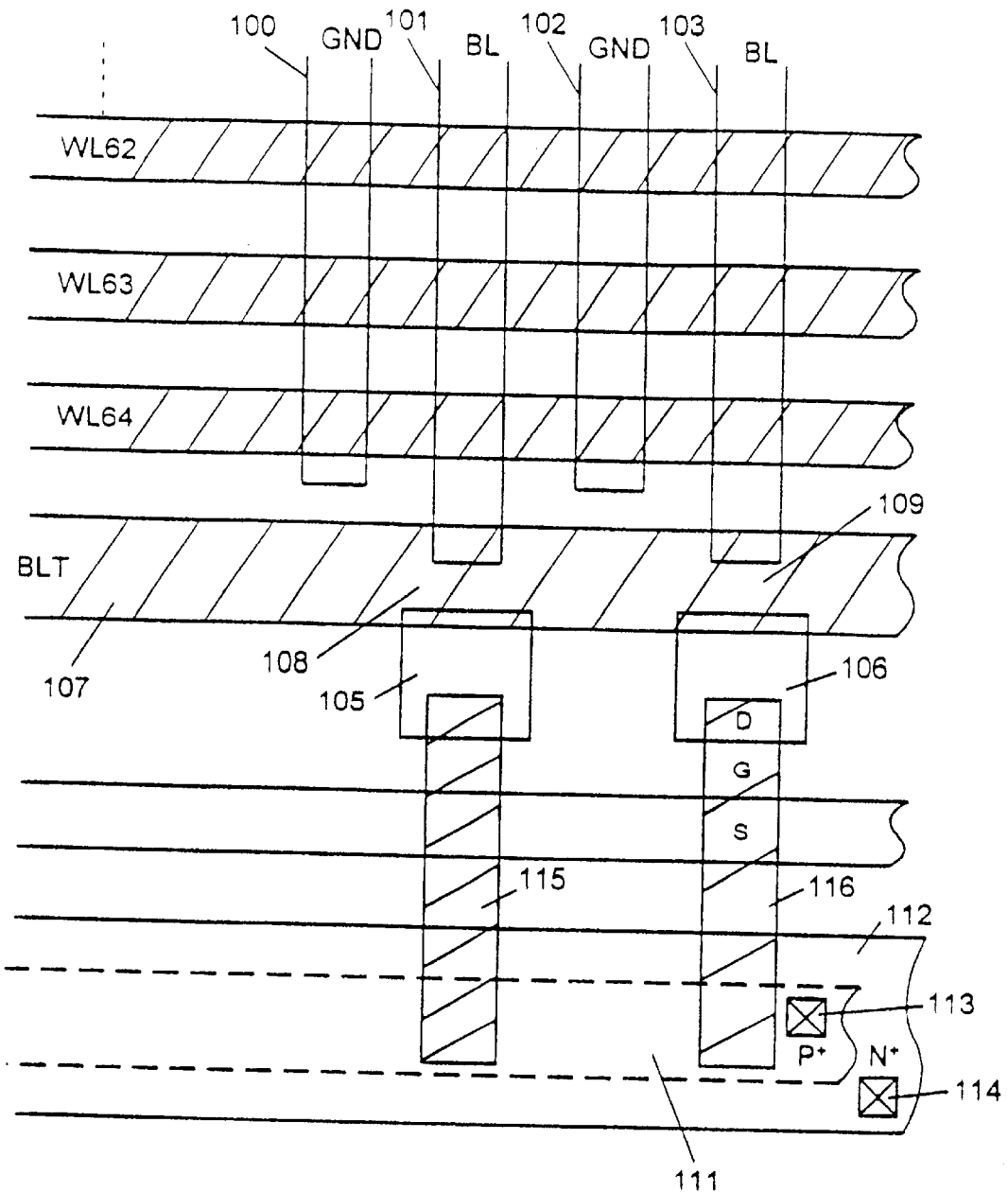
FIG. 7A is an illustration of a flat floating gate cell structure used for row redundancy in a flat mask ROM circuit.
Figure 7B:
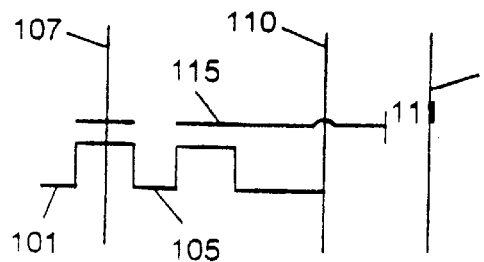
FIG. 7B shows a schematic symbol for the flat floating gate cell and select transistor of FIG. 7, for use in FIGS. 8 and 10.

FIG. 7 illustrates yet an alternative layout, where the drain regions are not coupled to metal contacts, but rather to local buried diffusion bit lines by the means of a block transistor in a flat ROM array. Thus, FIG. 7 illustrates a portion of a flat ROM array including word line WL62, word line WL63, and word line WL64. A buried diffusion ground line 100, buried diffusion bit line 101, buried diffusion ground line 102, and buried diffusion bit line 103 alternate through the array. A redundant row of floating gate cells is formed, with one floating gate cell for each bit line. Thus, a drain contact 105 is coupled with bit line 101 and a drain contact 106 is coupled with bit line 103. The drain contacts 105 and 106 are buried diffusion regions in the substrate. A block select word line 107 overlies the region between the bit line 101 and the contact 105 to establish a channel region 108 generally between the drain contact and the bit line. Similarly, a channel region 109 is formed between the bit line 103 and a drain contact 106. These provide select transistors for coupling the drain contacts to the buried diffusion bit lines.

Alternative embodiments include additional redundant cells, coupled with ground lines 100 and 102, particularly in virtual ground arrays where bit lines 101 and 103, and ground lines 100 and 102 are used for both data and ground. The redundant cells coupled to ground lines 100 and 102 preferably include drain contacts which are vertically staggered with respect to contacts 105 and 106 to preserve horizontal layout pitch.

A source diffusion line 110 is disposed in the integrated circuit substrate generally parallel to the word lines. A control gate diffusion line 111 is disposed in the integrated circuit substrate generally parallel to the word lines, and spaced away from the source diffusion line 110. The control gate diffusion line 111 is formed within an isolating diffusion region 112 having an opposite conductivity type. Contacts 113 and 114 are coupled to programming circuitry, which provides for reverse biasing in the diffusion regions 112 and 111 to provide isolation of the control gate from the substrate. ROM code implants, or other threshold enhancement implants are executed in the regions between the source diffusion 110 and the control gate diffusion 112, 113. Alternatively, thick oxide isolation structures can be made. Floating gate structures 115 and 116 overly the regions between the source diffusion region 110 and the drain contacts 105 and 106, respectively, and extend over the control gate diffusion region 111 as shown in the Figure. In cross-section, they have substantially the same structure as shown in FIGS. 4 and 5.

FIG. 7A illustrates a schematic symbol for the redundancy element in FIG. 7, where the reference numbers correspond to the structures of FIG. 7. This schematic symbol is used in the diagrams of FIGS. 8 and 10 which follow.

Figure 8:
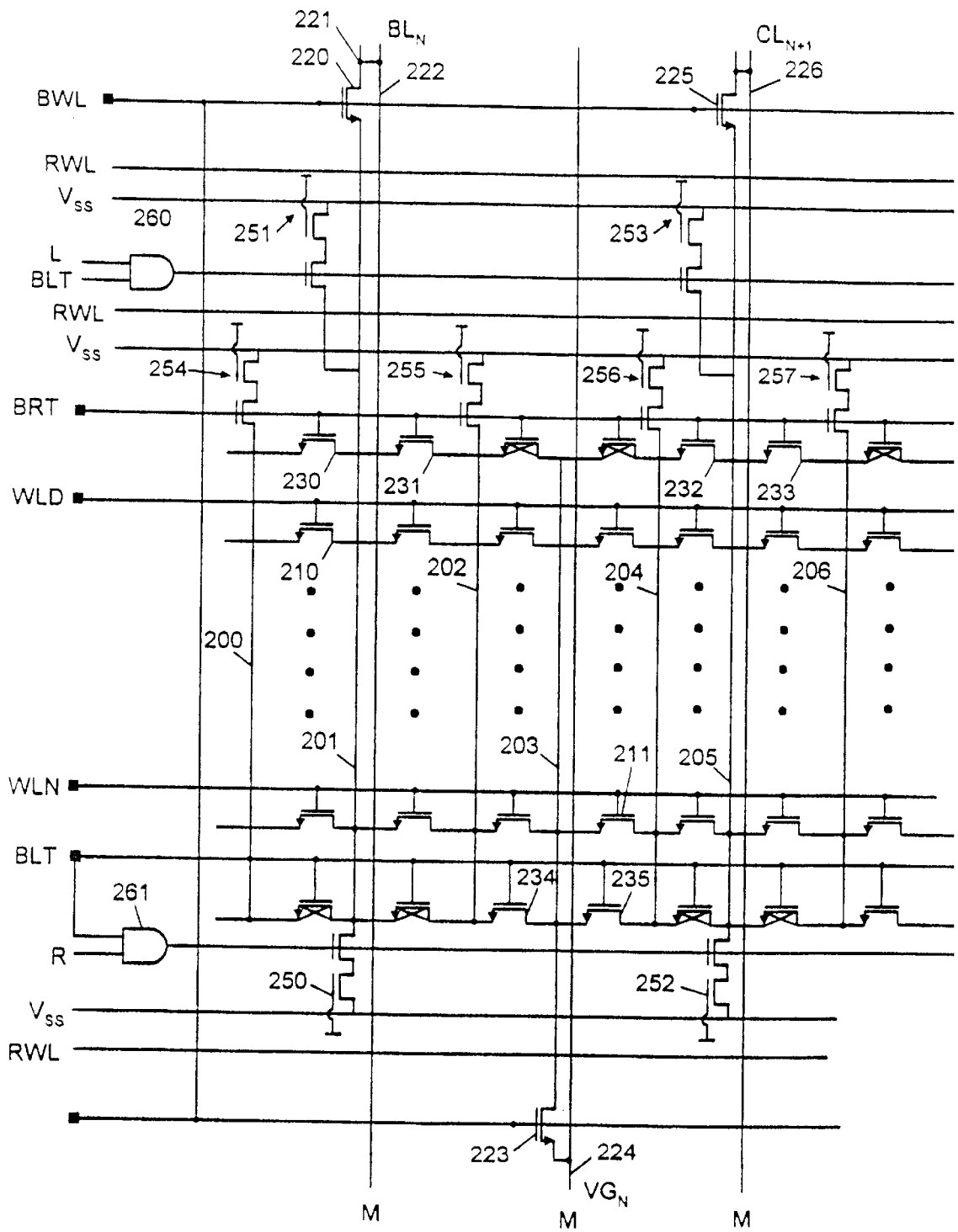
FIG. 8 is a circuit diagram illustrating one layout architecture for the use of flat floating gate cells as row redundancy elements in a mask ROM array.

FIG. 8 illustrates a flat mask ROM circuit schematic incorporating floating gate redundancy elements, such as those shown in FIG. 7 in a configuration for single bit per repaired row redundancy. The ROM array includes a plurality of word lines WL0 through WLN coupled to ROM cells in the array. The array includes a plurality of buried diffusion, local bit lines 200, 201, 202, 203, 204, 205, 206, which repeat across the array. Regions between the local bit lines 200 and 201, and under the word lines provide ROM memory cells, such as cell 210 coupled to word line WL0, and cell 211 coupled to word line WLN. The data in the array is established during manufacture by implants in the channel regions. Cells that have an implant in the channel region have a high threshold voltage, such that they do not conduct when a read potential is applied to the word line.

In the array shown in FIG. 8, the local bit line 201 extends to the source of a block select transistor 220. The drain of the block select transistor 220 is coupled to a metal contact 221 which connects to a metal bit line 222 (BL$_N$). The metal bit line 222 overlies and is insulated from the underlying array. Similarly, local bit line 203 is coupled to a block select transistor 223, for connecting the local bit line 203 to a metal virtual ground line 224 (VG$_N$). Local bit line 205 extends to the source of block select transistor 225 which connects the local bit line to the metal bit line 226 (BL$_{N+1}$). Every other local bit line 202, 204, 206 can be selectively connected either to a bit line on one side or a ground line on the other side through the left and right select structure based on the row of cells coupled to the BRT word line and the BLT word line. The ROM cells in the row connected to the BRT word line have implants between local bit lines 202 and 203 and between 203 and 204, and between 206 and the next line. Thus, when the BRT signal is asserted, the local bit lines 200, 201 and 202 are shorted together through transistors 230 and 231. Similarly, the local bit lines 204, 205, and 206 are shorted together through transistors 232 and 233. When the BLT signal is asserted, with implants between the local bit lines 200 and 201, between local bit lines 201 and 202, between local bit lines 204 and 205, and between local bit lines 205 and 206, transistors 234 and 235 short together diffusion regions 202, 203 and 204.

The block select transistors 220, 223, and 225 are controlled by the block word line BWL. When it is asserted, this sub-array is coupled to the bit lines. Otherwise, this sub-array is isolated from the bit lines. The particular column of cells which is accessed is determined by the BRT and BLT signals, in addition to column select decoding on the metal bit lines BL$_N$ and virtual ground line VG$_N$. Thus, when the column between diffusion lines 201 and 202 is to be selected, the BLT signal is asserted, and the BRT signal is low. The metal bit line 222 is coupled to the local bit line 201. The BLT signal shorts local bit line 202 to local bit line 203, and thus to the virtual ground metal line 224. Thus, the cell having the energized word line WL0 through WLN in a column between diffusion lines 201 and 202 is addressed.

The cell in between diffusion regions 200 and 201 is also energized by the word line, and current could flow to the bit line BL$_N$. However, the column select circuitry prevents current flow from the virtual ground line to the left of the FIG. 8, so that cells in the column between diffusion line 200 and 201 do not contribute to current on the bit line. To select that cell, the virtual ground line VG$_N$ 222 is disconnected from ground, and the virtual ground line to the right VG$_{N-1}$ would be coupled to ground allowing the cell on the left hand side to apply current to the bit line BL$_N$.

To access a cell between columns 202 and 203, the BRT signal is high, and the BLT signal is low. This couples the bit line 222 to the local bit line 202, and ground line 224 to the diffusion line 203. Again, whether the column between diffusion lines 202 and 203, or between diffusion lines 203 and 204 is selected depends on decoding at the bit line level.

As can be seen with reference to FIG. 7, a redundant cell for a row is required for each local bit line which acts as a drain in the array. Because the local bit line 201 and the local bit line 205 behave as the drain for two cells, two redundant elements, generally 250 and 251, are coupled with local bit line 201. Also, two redundant elements, generally 252 and 253, are coupled with local bit line 205. The local bit lines 200, 202, 204, and 206 may behave as drain for a single cell in the array, thus each one has a single floating gate redundancy element, generally 254 through 257.

The redundancy for the entire row is provided by selecting the redundant elements based on the BRT and BLT signals. Thus, the redundancy elements 251 and 253 are selected to replace cells between the local bit lines 200 and 201 and between the local lines 204 and 205, respectively. The redundancy elements 250 and 252 are selected to replace cells between local bit lines 201 and 202, and between local bit lines 205 and 206, respectively. These signals are logically controlled as illustrated by the logic AND function of the BLT signal and a control signal which indicates the left or right side cell for the local bit region 201 or 205. Thus, when the bit line BL$_N$, is used to access a cell to the left, the L signal at the input of the AND gate 260 is energized. When the bit line BL$_N$ is used to access a cell to the right, then the R signal at the input of and gate 261 is energized. Similarly, when a cell between the regions 202 or 203, or between regions 203 and 204 is selected, then the select circuit for the redundant cell is energized by the BRT signal.

Figure 9:
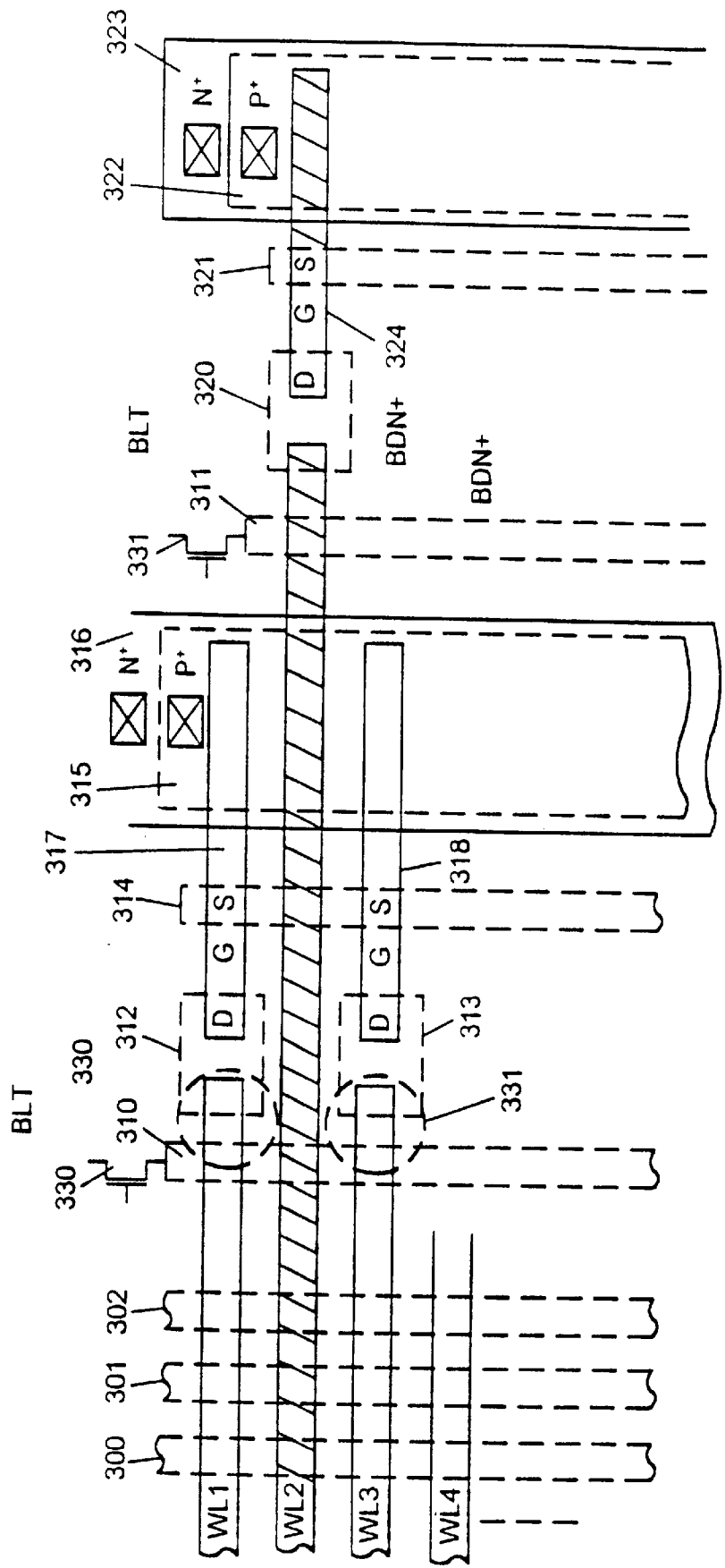
FIG. 9 is a layout diagram illustrating one implementation of the use of flat floating gate cells as column redundancy elements for a mask ROM.

FIG. 9 illustrates the layout of a ROM device with floating gate redundancy according to the present invention, where the redundancy is implemented as a replacement column. Thus, the array includes word lines WL1 through WL4 shown in the Figure. Buried diffusion bit lines 300, 301, and 302 are included in the array to establish a flat ROM array. A column of single polysilicon flat floating gate cells is used for the replacement element for the structure of FIG. 9. This column has a structure similar to that described with reference to FIG. 6, however it does not have metal contacts in the drain diffusion regions, rather it has select transistors for coupling the drain diffusion regions to a replacement bit line 310 or 311, which are responsive to signals on the word lines in the array. Thus, the structure includes a first replacement bit line 310 formed as a buried diffusion region in the substrate beneath the word lines, and a second buried diffusion 311 similarly formed, but spaced away from the first diffusion line 310 enough to allow formation of floating gate cells between the two bit lines as shown. This allows the vertical pitch of the ROM cell to be reduced, because the drain contact pitch is distributed in two columns, rather than in one. Thus, the first column of cells in the replacement column includes a plurality of drain contacts 312, 313 corresponding to every other word line, or odd word lines, in the array. The word lines WL1 and WL3 extend over the additional buried diffusion bit line 310, and the drain contacts 312 and 313, providing select transistors 330, 331 between the drain contact and the buried diffusion line. Thus, when one of the word lines WL1 and WL3 is at high voltage, the corresponding drain contact 312 or 313 is coupled to the replacement bit line 310.

A floating gate cell is formed to the right of the drain contacts 312 and 313 in the Figure. Thus, a source diffusion region 314 extending generally parallel to the bit lines in the array, and a control gate diffusion region 315 extending parallel to the bit lines in the array are formed. The control gate diffusion region 315 is formed within a deeper diffusion region 316 of opposite polarity type. Floating gates 317 and 318 extend over the channel regions between the contacts 312 and 313 and the source region 314, and over the control gate region 315 as shown in the figure. Threshold enhancement implants are placed in substrate areas not acting as channels, as discussed above.

The second column of cells for the replacement column is coupled with the even word lines WL2, WL4, and so on. Thus, a drain contact 320 is associated with word line WL2. A select transistor is formed between the additional bit line 311, and the drain contact 320 underneath the word line WL2. The floating gate cell is formed to the right. Thus, a source diffusion line 321 and a control gate diffusion line 322 formed of a p+ diffusion embedded in a n diffusion 323 is provided. The floating gate structure 324 overlies the channel region between the drain contact region 320 and the source diffusion 321 and extends over the control gate 322.

The buried diffusion lines 310 and 311 which provide the replacement bit line are coupled to a replacement metal line by means of an even and odd block transistors 330 and 331, respectively. Thus, when odd word lines are selected, the block transistor 330 is turned on coupling bit line 310 to the I/O circuitry. When even word lines are selected, the transistor 331 is turned on coupling floating gate cells which are coupled to additional diffusion line 311 to the I/0 circuitry.

Figure 10:
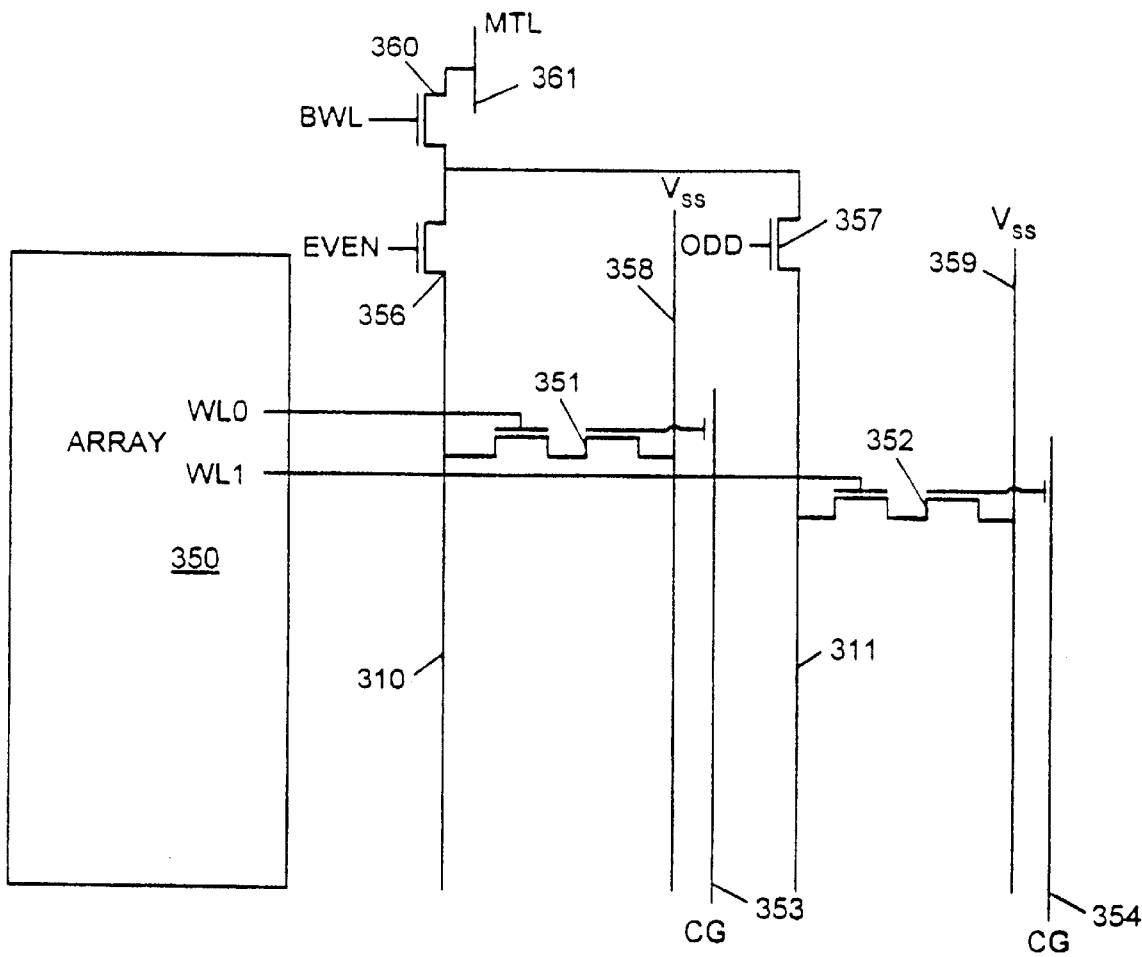
FIG. 10 illustrates the circuit schematic diagram for the column redundancy layout of FIG. 9.

FIG. 10 shows a circuit schematic of the redundant column laid out according to FIG. 9. Thus, the integrated circuit array, generally 350, is shown in the Figure. An even word line WL0 is coupled to a first floating gate cell 351, and an odd word line WL1 is coupled to the floating gate cell 352. The control gate line 353 and the control gate line 354 are coupled together and driven by the replacement column driver. Similarly, the ground lines 358 and 359 are coupled to the virtual ground supply V$_{SS}$. Select transistors 356 and 357 selectively connect the floating gate cells coupled to the additional bit line 310, and the floating gate cells coupled the additional bit line 311 to a block select transistor 360 which is controlled by a block word line BWL. The block select transistor 360 couples the redundant column to a metal bit line 361.

FIGS. 11A–11B, 12A–12B, and 13A–13B illustrate alternative floating gate cells using a diffusion region as a control gate, which could be utilized for redundancy according to the present invention.

Figure 11A:
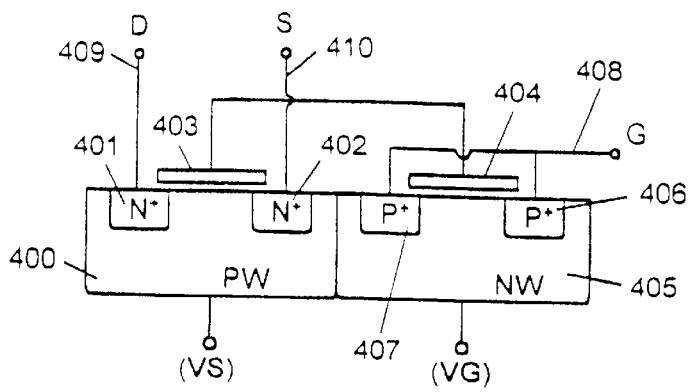
FIGS. 11A and 11B illustrate a schematic side view and top layout view of a PMOS/CMOS floating gate cell which can be used for redundancy according to the present invention.

In FIG. 11A, a floating gate memory cell is illustrated which is implemented using an NMOS transistor formed in a p-well 400 by n-type diffusion region 401 and n-type diffusion region 402. A gate 403 of the NMOS transistor is connected to gate 404 of a PMOS transistor formed in n-well 405. The PMOS transistor is formed by the p-type diffusions 406 and 407. To form a floating gate memory cell, the diffusion regions 405 and 407 are connected together and act as the control gate terminal 408. The diffusion region 401 acts as the drain 409 of the device and the diffusion region 402 acts as the source 410 of the device. During operation, the PMOS transistor in the n-well 405 will be in the on condition, such that the channel between the diffusion regions 407 and 406 will act as a conductive region for the control gate function.

Figure 11B:
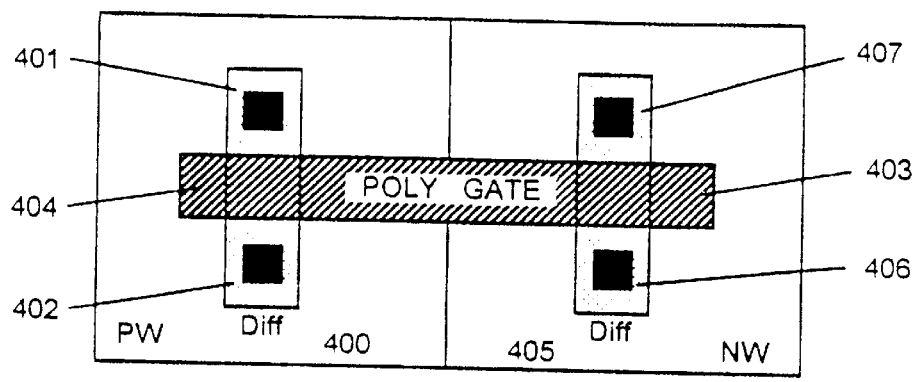

FIG. 11B shows a top view of one layout of the structure of FIG. 11A. Note that the diffusion regions 407 and 406 are laid out vertically in FIG. 11B, which is orthogonal to that shown in FIG. 11A. The gate 403 of the NMOS transistor and the gate 404 of the PMOS transistor are a single piece of polysilicon as shown in FIG. 11B. The diffusion region 401 and the diffusion region 402 in the p-well 400 provide the NMOS transistor. A thin insulator isolates the polysilicon material of the gates 403, 404 from the substrate.

Figure 12A:
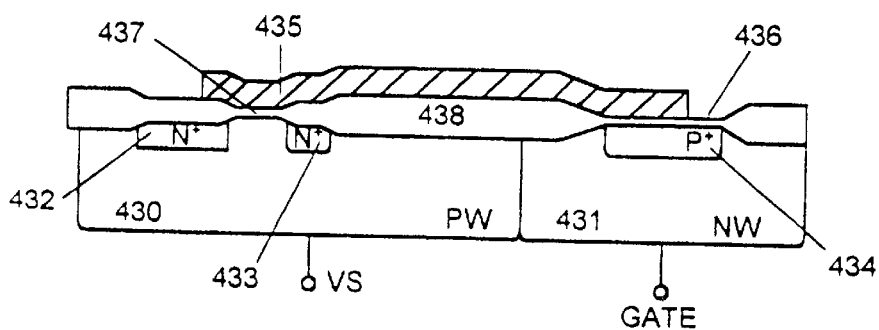
FIGS. 12A and 12B illustrate a side view and a top view of a p-well, n-well floating gate cell which might be used for redundancy according to the present invention.
Figure 12B:
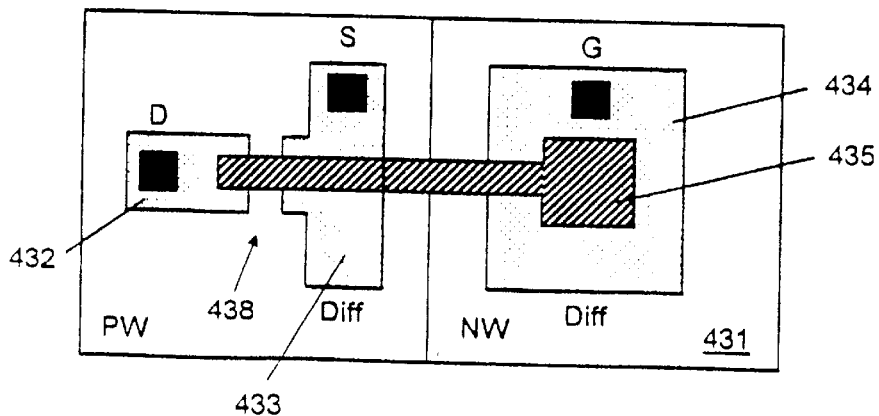

FIGS. 12A and 12B illustrate another layout of a floating gate transistor which could be used for redundancy according to the present invention. As can be seen in FIG. 12A, the structure includes a p-well 430 and an n-well 431. An n-type diffusion region 432 is formed in the p-well 430 to provide a drain. An n-type diffusion region 433 is also formed in the p-well 430 to act as a source. In the n-well 431, a p-type diffusion 434 is formed to act as the control gate. A polysilicon floating gate 435 is deposited over the structure, so that it overlies a thin insulator 436 over the control gate diffusion 434, and a thin insulator 437 over the channel between the source diffusion 433 and the drain diffusion 432. The oxide region 438 between the control gate 434 and the source 433 is a field oxide which is substantially thicker than the thin oxides over the control gate and over the channel.

FIG. 12B shows a top view of the structure shown in FIG. 12A. Thus, the drain diffusion 432 and the source diffusion 433 are separated by a channel region. The control gate diffusion 434 is formed in an n-well 431. A polysilicon layer is laid out over the control gate to establish the floating gate 435.

This structure provides significant manufacturing flexibility to set the coupling ratio and therefore the programming characteristics of the floating gate being utilized. The shape and area of the floating gate polysilicon 435 and the thickness of the insulators in the control gate and channel regions can be adapted to a particular design specification.

Figure 13A:
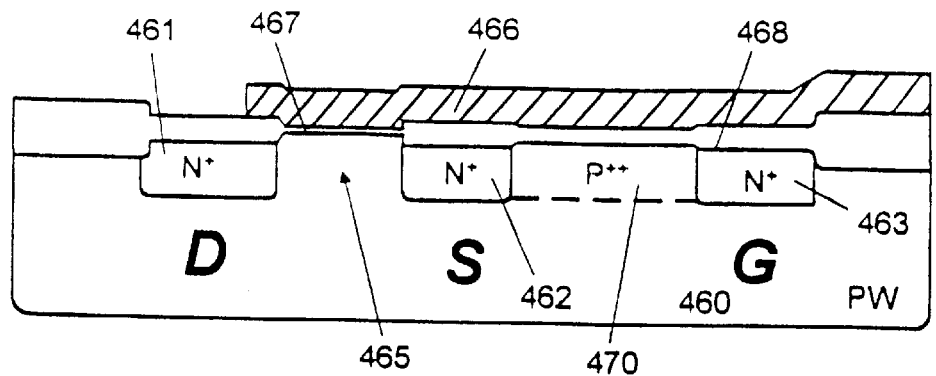
FIGS. 13A and 13B show a side view and a top view of a floating gate cell in a p-well or p-type substrate which can be used according to the present invention.
Figure 13B:
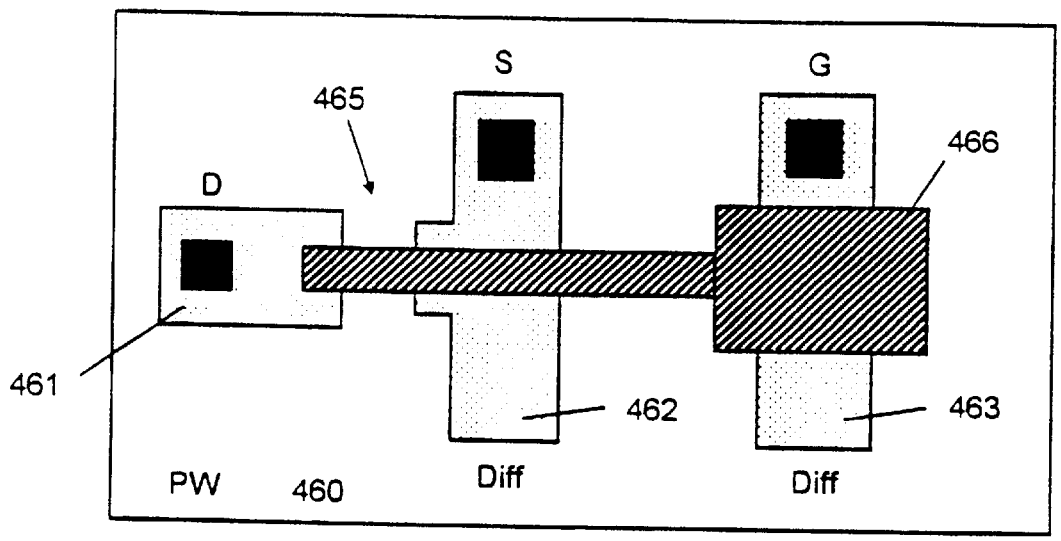

FIGS. 13A and 13B show yet another alternative floating gate cell which could be utilized according to the present invention. In the alternative shown in FIG. 13A, the device is formed in a single p-well 460. N+ diffusion region 461 is utilized for the drain. N+ diffusion region 462 is utilized as the source. N+ diffusion region 463 is utilized as the control gate. The source region 462 and control gate region 463 are spaced apart from one another, with sufficient distance that no significant current leakage occurs across that region of the substrate 460. The channel 465 is established between the drain and source regions 461 and 462. The channel 465 is defined using a mask prior to the implant which defines the drain and source regions. After defining the drain, source, and gate regions, a polysilicon layer is deposited to define the floating gate 466 over the control gate region 463.

The oxide 467 beneath the floating gate 466 is designed for tunneling or hot electron injection as suits the particular design. The oxide 468 over the control gate 463 can be thicker. Again, these parameters are designed according to the specifications of a particular implementation.

The region 470 is implanted with a P++ doping, or other implant which raises the threshold of the transistor-like region (parasitic transistor) between the control gate 463 and source 462, to prevent current flow. This also allows thinner oxide in the region.

FIG. 13B shows a top view of the structure of FIG. 13A, with like reference numbers. As in FIG. 12B, it can be seen that the drain and source are laid out in a T-shape in this example. Other shapes may be used. The control gate region 463 is spaced apart from the source region 462. The floating gate 466 has a shape designed to provide a capacitive coupling ratio between the control gate and the source and drain as suits the specifications of the floating gate cell being designed.

Figure 14:
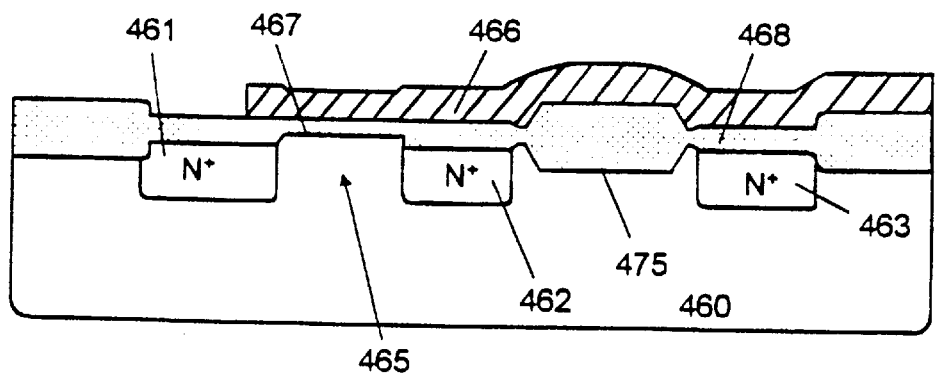
FIG. 14 is a side view of an alternative floating gate cell, like the cell of FIGS. 13A and 13B.

FIG. 14 illustrates, with like reference numbers, the structure of FIG. 13A, modified by replacing the implant region 470 with a dielectric filled trench, or thick oxide 475. The thick oxide 475 provides isolation between the regions 462 and 463, by preventions formation of a parasitic transistor.

Accordingly, a variety of floating gate architectures can be utilized to provide redundancy in read-only memory chips according to the present invention. Also, these technologies can be applied to other types of memory chips as suits a particular application. A variety of layouts in floating gate devices which can be utilized according to this invention, greatly improves the range of memory architectures in which the horizontally laid out floating gate redundancy cells may be used.

Accordingly, the present invention provides for the use of floating gate memory cells as redundancy elements in memory circuits, and particularly in flat mask ROM arrays, based on the use of a single polysilicon non-volatile memory device as the redundancy element. The redundancy element can be implemented without thick field oxide regions on the device, preserving the flat layout particularly important in mask ROM devices. The control gate is formed in a p-type region inside an n-type region, and the n-type region resides in the p-type substrate. This allows the floating gate poly to be coupled either to a positive or negative voltage through the control gate, by altering the polarity of the bias on the p-type and n-type regions. The p-type control gate region can be formed either during threshold adjustment implant for the peripherals, for the array, or during the adjustment implant for the ROM cells. Further, the region could be formed during the ROM code implant step, where the boron implant of the ROM code implant process can penetrate the floating gate poly and reside underneath the polysilicon.

To make the floating gate negatively charged, either hot electron programming or F–N tunneling programming can be utilized as described above. Further, removing a negative charge in the floating gate can be accomplished by F–N tunneling to the channel and source/drain regions of the device, or only through the source or drain region where the gate is initially negatively biased. The present invention allows application of redundancy to mask ROM devices, which are very dense, while improving the yield of the manufacturing process significantly.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A read-only memory device, comprising:
    an array of read-only memory cells having a memory cell structure, the array including word lines and bit lines, the read-only memory cells arranged in a plurality of rows coupled to respective word lines in the array and in a plurality of columns coupled to respective bitlines in the array;
    an additional row or column of electrically programmable memory cells having a memory cell structure different than the memory cell structure of the array of read-only memory cells, the electrically programmable memory cells in the additional row or column associated with at least one of a word line and a bit line in the array;
    a row or column decoder, coupled to the word lines and bit lines in the array of read-only memory cells, responsive to addresses corresponding to rows or columns in the array for selecting addressed rows or columns;
    control circuitry including a programmable store to identify a defective row or column in the array to be replaced by the additional row or column, which in response to an address corresponding to the defective row or column, couples the additional row or column in place of the defective row or column to said associated at least one of a word line and a bit line; and
    circuitry providing access to the additional row or column for programming the additional row or column with data of the defective row or column.

2. The read-only memory device of claim 1, wherein the additional row or column of electrically programmable memory cells comprises a row or column of floating gate cells having buried diffusion control gates.

3. The read-only memory device of claim 1, wherein the array of read-only memory cells comprises an array of MOS mask ROM cells.

4. The read-only memory device of claim 1, wherein the array of read-only memory cells comprises an array of MOS mask ROM cells; and the additional row or column of electrically programmable memory cells comprises a row or column of floating gate cells having buried diffusion control gates.

5. The read-only memory device of claim 1, wherein the array of read-only memory cells comprises a flat array of MOS mask ROM cells; and the additional row or column of electrically programmable memory cells comprises a row or column of floating gate cells having buried diffusion control gates, sources and drains, and having floating gates capacitively coupled to the control gates and to channel regions between the sources and drains.

6. The read-only memory device of claim 5, including an isolation structure coupled with a particular floating gate cell in the additional row or column, isolating the control gate from the source of the particular floating gate cell.

7. The row of redundancy elements of claim 6, wherein the isolation structure comprises a doped region in the substrate causing a high threshold for a parasitic transistor beneath the floating gate of the particular floating gate cell.

8. The row of redundancy elements of claim 6, wherein the isolation structure comprises a dielectric under the floating gate of the particular floating gate cell extending into the substrate.

9. The read-only memory device of claim 1, wherein the array comprises a plurality of blocks of cells, the blocks of cells including a plurality of local bit lines coupled to cells in corresponding columns in the block, and wherein the additional row or column of electrically programmable memory cells comprises a row of floating gate cells for a given block, coupled with the local bit lines in the given block.

10. The read-only memory device of claim 1, wherein the additional row or column of electrically programmable memory cells comprises a column of floating gate cells, coupled with corresponding word lines in the plurality of word lines.

11. A memory device in a semiconductor substrate of a first conductivity type, comprising:

a plurality of conductive buried diffusion lines of a second conductivity type arranged generally parallel in a first direction;

a plurality of word lines, overlying and insulated from the plurality of conductive buried diffusion lines, arranged generally orthogonal to the first direction, such that regions in the semiconductor substrate beneath word lines and between respective pairs of buried diffusion lines provide channel regions for an array of read-only memory cells;

implants in a subset of the channel regions in the array, the implants establishing data in the array;

a plurality of bit line conductors, overlying and insulated from the plurality of word lines and the plurality of buried diffusion lines;

circuitry coupled to the plurality of buried diffusion lines and the plurality of bit line conductors, to selectively connect buried diffusion lines to bit line conductors;

a plurality of column select transistors, coupled to corresponding bit line conductors and responsive to addresses corresponding to columns in the array to selectively connect addressed columns to output circuitry;

a row decoder coupled to the plurality of word lines and responsive to addresses corresponding to rows in the array to select word lines of addressed rows;

a first additional buried diffusion line of the second conductivity type arranged generally parallel to the plurality of word lines;

a second additional buried diffusion line arranged generally parallel to the plurality of word lines, and isolated from the first additional buried diffusion line;

a plurality of buried diffusion drain contacts adjacent corresponding ones of said plurality of buried diffusion lines;

an additional conductor, near and insulated from the plurality of conductive buried diffusion lines and the plurality of drain contacts, and arranged generally parallel to the plurality of word lines so that regions in the semiconductor substrate between the plurality of conductive buried diffusion lines and the plurality of drain contacts provide a set of channel regions for select transistors which connect the plurality of drain contacts to corresponding ones of the plurality of buried diffusion lines in response to a signal on the additional conductor;

a plurality of floating gates, each overlying a region between a corresponding drain contact and the first additional buried diffusion line and extending over the second additional buried diffusion line, arranged so that regions between the first additional buried diffusion line and the plurality of drain contacts provide channel regions for a row of floating gate memory cells, the first additional buried diffusion line providing source regions and the second additional buried diffusion line providing control gates;

control circuitry, including a programmable store to identify a defective row in the array to be replaced by the row of floating gate memory cells, which in response to an address corresponding to the defective row, accesses the row of floating gate cells in place of the defective row; and circuitry providing access to the row of floating gate cells for programming the row of floating gate cells with data of the defective row.

12. The memory device of claim 11, wherein the second additional buried diffusion line includes an isolation buried diffusion region of the second conductivity type in the semiconductor substrate, and a control gate buried diffusion region of the first conductivity type within the isolation buried diffusion region, the control gate buried diffusion region and the isolation buried diffusion region coupled to the circuitry providing access so that positive and negative bias potentials may be applied to the control gate buried diffusion region.

13. The memory device of claim 11, wherein the second additional buried diffusion line includes a control gate buried diffusion region of the first conductivity type, and including an isolation structure isolating the first additional buried diffusion line from the second additional buried diffusion line.

14. The memory device of claim 13, wherein the isolation structure comprises a doped region or doped regions in the substrate causing a high threshold for parasitic transistors beneath floating gates in the plurality of floating gates.

15. The memory device of claim 13, wherein the isolation structure comprises a dielectric under floating gates in the plurality of floatingy gates.

16. A read-only memory device, comprising:

an array of read-only memory cells arranged in a plurality of rows and columns;

an additional column of electrically programmable memory cells, the electrically programmable memory cells having a structure different than the read-only memory cells in the array;

a decoder, coupled to the array of read-only memory cells, responsive to addresses corresponding to columns in the array for selecting addressed columns;

control circuitry including a programmable store to identify a defective column in the array to be replaced by the additional column, which in response to an address corresponding to the defective column, selects the additional column in place of the defective column; and circuitry providing access to the additional column for programming the additional column with data of the defective row or column.

17. The read-only memory device of claim 16, wherein the additional column of electrically programmable cells comprises a column of floating gate cells having buried diffusion control gates.

18. The read-only memory device of claim 16, wherein the array of read-only memory cells comprises an array of MOS mask ROM cells.

19. The read-only memory device of claim 16, wherein the array of read-only memory cells comprises an array of MOS mask ROM cells; and the additional column of electrically programmable cells comprises a column of floating gate cells having buried diffusion control gates.

20. The read-only memory device of claim 16, wherein the array of read-only memory cells comprises a flat array of MOS mask ROM cells; and the additional column of electrically programmable cells comprises a column of floating gate cells having buried diffusion control gates, sources and drains, and having floating gates capacitively coupled to the control gates and to channel regions between the sources and drains.

21. The read-only memory device of claim 20, including an isolation structure coupled with a particular floating gate cell in the additional column, isolating the control gate from the source of the particular floating gate cell.

22. The read-only memory device of claim 21, wherein the isolation structure comprises a doped region in the substrate causing a high threshold for a parasitic transistor beneath the floating gate of the particular floating gate cell.

23. The read-only memory device of claim 21, wherein the isolation structure comprises a dielectric under the floating gate of the particular floating gate cell extending into the substrate.

24. The read-only memory device of claim 16, wherein the additional column of electrically programmable cells comprises a column of floating gate cells, having control gate terminals associated with corresponding word lines along rows in the array.

* * * * *